United States Patent
Wu et al.

(10) Patent No.: US 7,326,444 B1
(45) Date of Patent: *Feb. 5, 2008

(54) METHODS FOR IMPROVING INTEGRATION PERFORMANCE OF LOW STRESS CDO FILMS

(75) Inventors: Qingguo Wu, Tualatin, OR (US); Dong Niu, Tualatin, OR (US); Honghong Wang, Hillsboro, OR (US); Haiying Fu, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/941,502

(22) Filed: Sep. 14, 2004

(51) Int. Cl.
*H05H 1/24* (2006.01)
(52) U.S. Cl. .................... 427/579; 427/96.8
(58) Field of Classification Search ........... 427/255.29, 427/255.27, 255.37, 579
See application file for complete search history.

(56) References Cited

U.S. PATENT DOCUMENTS

| | | | |
|---|---|---|---|
| 4,357,451 A | 11/1982 | McDaniel | |
| 4,882,008 A | 11/1989 | Garza et al. | |
| 4,885,262 A | 12/1989 | Ting et al. | |
| 5,504,042 A | 4/1996 | Cho et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,849,640 A | 12/1998 | Hsia et al. | |
| 5,851,715 A | 12/1998 | Barthel et al. | |
| 5,858,457 A | 1/1999 | Brinker et al. | |
| 5,920,790 A | 7/1999 | Wetzel et al. | |

(Continued)

FOREIGN PATENT DOCUMENTS

WO    WO95/07543    3/1995

(Continued)

OTHER PUBLICATIONS

Jan, C.H., et al, *90NM Generation, 300mm Wafer Low k ILD/Cu Interconnect Technology*, 2003 IEEE Interconnect Technology Conference.

(Continued)

*Primary Examiner*—Bret Chen
(74) *Attorney, Agent, or Firm*—Beyer Weaver LLP

(57) ABSTRACT

Methods of preparing a carbon doped oxide (CDO) layer with a low dielectric constant (<3) and low residual stress without sacrificing important integration properties such as dry etch rate, film stability during wet cleaning, electrical leakage current, and extinction coefficient are provided. The methods involve, for instance, providing a substrate to a deposition chamber and exposing it to a chemical precursor having molecules with at least one carbon-carbon triple bond, followed by igniting and maintaining a plasma in a deposition chamber using radio frequency power having high and low frequency components or one frequency component only, and depositing the carbon doped oxide film under conditions in which the resulting dielectric layer has a compressive stress or a tensile stress of between about −20 to 30 MPa and a dielectric constant of between about 2.5-3.0, a C≡C to SiO bond ratio of between about 0.05% to 5%, a SiC to SiO bond ratio of between about 2% to 10%, and a refractive index (RI) of 1.39-1.52 measured at 633 nm.

29 Claims, 13 Drawing Sheets

U.S. PATENT DOCUMENTS

| | | | |
|---|---|---|---|
| 6,140,252 A | 10/2000 | Cho et al. | |
| 6,149,828 A | 11/2000 | Vaartstra | |
| 6,171,661 B1 | 1/2001 | Zheng et al. | |
| 6,177,329 B1 | 1/2001 | Pang | |
| 6,232,658 B1 * | 5/2001 | Catabay et al. | 257/701 |
| 6,258,735 B1 | 7/2001 | Xia et al. | |
| 6,268,276 B1 | 7/2001 | Chan et al. | |
| 6,270,846 B1 | 8/2001 | Brinker et al. | |
| 6,271,273 B1 | 8/2001 | You et al. | |
| 6,306,564 B1 | 10/2001 | Mullee | |
| 6,312,793 B1 | 11/2001 | Grill et al. | |
| 6,329,017 B1 | 12/2001 | Liu et al. | |
| 6,329,062 B1 | 12/2001 | Gaynor | |
| 6,331,480 B1 | 12/2001 | Tsai et al. | |
| 6,340,628 B1 | 1/2002 | Van Cleemput et al. | 438/586 |
| 6,365,266 B1 | 4/2002 | MacDougall et al. | |
| 6,365,528 B1 | 4/2002 | Sukharev et al. | |
| 6,383,466 B1 | 5/2002 | Domansky et al. | |
| 6,383,955 B1 | 5/2002 | Matsuki et al. | 438/790 |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,407,013 B1 | 6/2002 | Li et al. | |
| 6,413,583 B1 | 7/2002 | Moghadam et al. | |
| 6,420,441 B1 | 7/2002 | Allen et al. | |
| 6,444,715 B1 | 9/2002 | Mukherjee et al. | |
| 6,455,417 B1 | 9/2002 | Bao et al. | |
| 6,479,374 B1 | 11/2002 | Ioka et al. | |
| 6,500,770 B1 | 12/2002 | Cheng et al. | |
| 6,548,113 B1 | 4/2003 | Birnbaum et al. | |
| 6,566,278 B1 | 5/2003 | Harvey et al. | |
| 6,572,925 B2 | 6/2003 | Zubkov et al. | |
| 6,573,030 B1 | 6/2003 | Fairbairn et al. | |
| 6,576,345 B1 | 6/2003 | Cleemput et al. | |
| 6,596,467 B2 | 7/2003 | Gallagher et al. | |
| 6,596,654 B1 | 7/2003 | Bayman et al. | 438/788 |
| 6,610,362 B1 | 8/2003 | Towle | |
| 6,632,478 B2 | 10/2003 | Gaillard et al. | |
| 6,662,631 B2 | 12/2003 | Baklanov et al. | |
| 6,667,147 B2 | 12/2003 | Gallagher et al. | |
| 6,677,251 B1 | 1/2004 | Lu et al. | |
| 6,715,498 B1 | 4/2004 | Humayun et al. | |
| 6,756,085 B2 | 6/2004 | Waldfried et al. | |
| 6,797,643 B2 | 9/2004 | Rocha-Alvarez et al. | |
| 6,805,801 B1 | 10/2004 | Humayun et al. | |
| 6,812,043 B2 | 11/2004 | Bao et al. | |
| 6,815,373 B2 | 11/2004 | Singh et al. | |
| 6,831,284 B2 | 12/2004 | Demos et al. | |
| 6,846,380 B2 | 1/2005 | Dickinson et al. | |
| 6,848,458 B1 | 2/2005 | Shrinivasan et al. | |
| 6,849,549 B1 | 2/2005 | Chiou et al. | |
| 6,867,086 B1 * | 3/2005 | Chen et al. | 438/219 |
| 6,903,004 B1 * | 6/2005 | Spencer et al. | 438/624 |
| 6,914,014 B2 | 7/2005 | Li et al. | |
| 6,943,121 B2 | 9/2005 | Leu et al. | |
| 7,018,918 B2 | 3/2006 | Kloster et al. | |
| 7,087,271 B2 | 8/2006 | Rhee et al. | |
| 7,094,713 B1 | 8/2006 | Niu et al. | |
| 7,098,149 B2 | 8/2006 | Lukas et al. | |
| 7,241,704 B1 | 7/2007 | Wu et al. | |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0064341 A1 | 5/2002 | Fauver et al. | |
| 2002/0106500 A1 | 8/2002 | Albano et al. | |
| 2002/0123240 A1 | 9/2002 | Gallagher et al. | |
| 2002/0132496 A1 | 9/2002 | Ball et al. | |
| 2002/0141024 A1 | 10/2002 | Retschke et al. | |
| 2002/0192980 A1 | 12/2002 | Hogle et al. | |
| 2003/0064607 A1 | 4/2003 | Leu et al. | |
| 2003/0066544 A1 | 4/2003 | Jur et al. | |
| 2003/0111263 A1 | 6/2003 | Fornof et al. | |
| 2003/0119307 A1 | 6/2003 | Bekiaris et al. | |
| 2003/0157248 A1 | 8/2003 | Watkins et al. | |
| 2003/0198895 A1 | 10/2003 | Toma et al. | |
| 2003/0224156 A1 | 12/2003 | Kirner et al. | |
| 2004/0018717 A1 | 1/2004 | Fornof et al. | |
| 2004/0069410 A1 | 4/2004 | Moghadam et al. | |
| 2004/0096586 A1 | 5/2004 | Schulberg et al. | |
| 2004/0096593 A1 | 5/2004 | Lukas et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0102032 A1 | 5/2004 | Kloster et al. | |
| 2004/0161532 A1 | 8/2004 | Kloster et al. | |
| 2004/0170760 A1 * | 9/2004 | Meagley et al. | 427/248.1 |
| 2004/0185679 A1 * | 9/2004 | Ott et al. | 438/781 |
| 2004/0213911 A1 | 10/2004 | Misawa et al. | |
| 2004/0249006 A1 | 12/2004 | Gleason et al. | |
| 2005/0064698 A1 | 3/2005 | Chang et al. | |
| 2005/0095840 A1 | 5/2005 | Bhanap et al. | |
| 2005/0230834 A1 | 10/2005 | Schmitt | |
| 2006/0040507 A1 | 2/2006 | Mak et al. | |
| 2006/0105566 A1 | 5/2006 | Waldfried et al. | |
| 2006/0110931 A1 | 5/2006 | Fukazawa et al. | |
| 2006/0145305 A1 | 7/2006 | Boyanov et al. | |
| 2006/0178006 A1 | 8/2006 | Xu et al. | |
| 2006/0197881 A1 | 9/2006 | Kang et al. | |

FOREIGN PATENT DOCUMENTS

| | | | |
|---|---|---|---|
| WO | WO 03/005429 | * | 1/2003 |
| WO | WO 03/052794 | | 6/2003 |

OTHER PUBLICATIONS

U.S. Appl. No. 10/789,103, entitled: Methods for Producing Low-K CDO Films With Low Residual Stress, Wu et al.

U.S. Appl. No. 10/820,525, entitled: Methods for Producing Low-K CDO Films With Low Residual Stress, Wu et al.

U.S. Appl. No. 10/800,409, entitled: Methods for Producing Low-K CDO Films, Wu et al.

Cho et al. "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.

Humayun et al., "Method for Forming Porous Films By Porogen Removel Combined Wtih In SITU Surface Modification", Novellus Corporation, U.S. Appl. No. 10/404,693, filed Mar. 31, 2003, pp. 1-32.

Tipton et al., "Method Of Porogen Removal From Porous Low-K Films Using UV Radiation", Novellus Systems, Inc., U.S. Appl. No. 10/672,311, filed Sep. 26, 2003, pp. 1-27.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems Inc., U.S. Appl. No. 10/800,377, filed Mar. 11, 2004, pp. 1-31.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.
Humayun et al., "Method For Forming Porous Films By Porogen Removal Combined With In Situ Modification", U.S. Appl. No. 10/404,693, filed Mar. 31, 2003, Office Action dated Mar. 15, 2005.
Tipton et al., "Method Of Porogen Removal From Porous Low-K Films Using UV Radiation,", U.S. Appl. No. 10/672,311, filed Sep. 26, 2003, Office Action dated Sep. 7, 2004.
Tipton et al., "Method Of Porogen Removal From Porous Low-K Films Using UV Radiation", U.S. Appl. No. 10/672,311, filed Sep. 26, 2003, Office Action dated Dec. 28, 2004.
Tipton et al., "Method For Removal Of Porogens From Porous Low-K Films Using Supercritical Fluids", U.S. Appl. No. 10/672,305, Office Action dated Mar. 22, 2005.
Bandyopadhyay et al., "Method to Improve Mechanical Strength of Low-K Dielectric Film Using Modulated UV Exposure", U.S. Appl. No. 10/825,888, filed Apr. 16, 2004.
R.D. Miller et al., "Phase-Separated Inorganic-Organic Hybrids for Microelectronic Applications," MRS Bulletin, Oct. 1997, pp. 44-48.
Jin et al., "Nanoporous Silica as an Ultralow-$k$ Dielectric," MRS Bulletin, Oct. 1997, pp. 39-42.
Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.
Asoh et al., "Conditions for Fabrication of Ideally Ordered Anodic Porous Alumina Using Pretextured Al," Journal of the Electrochemica Society, 148 (4) B152-B156 (2001) pp. B152-B156.
Holland et al., "Nonlithographic Technique for the Production of Large Area High Density Gridded Field Sources," J. Vac. Sci. Technol. B 17(2), Mar./Apr. 1999, pp. 580-582.
Masuda et al. "Highly Ordered Nanochannel-Array Architecture in Anodic Alumina," App. Phys. Lett. 71(19), Nov. 1997, pp. 2770-2772.
Clube et al., White Paper from Holotronic Technologies SA; downloaded from www.hdotronic.com/whitepaper/fine-patt.pdf on Mar. 12, 2002.
Meli et al., "Self-Assembled Masks for the Transfer of Nanometer-Scale Patterns into Surfaces: Characterization by AFM and LFM", Nano Letters, vol. 2, No. 2, 2002, 131-135.
"Shipley Claims Porous Low K Dielectric Breakthrough," Press Release Mar. 17, 2003.
Jeffrey M. Calvert and Michael K. Gallagher, Semiconductor International, 26 (12), 56 (2003).
Van Bavel et al., Future Fab International, 16, (2004).
Caluwaerts et al, "Post Patterning Meso Porosity Creation: A Potential Solution For Pore Sealing," IITC 2003.
Peter Singer, "New Materials and Designs to Improve Transistor Performance", Apr. 1, 2004, Semiconductor International.
Ghani et al, "A 90nm High Volume Manufacturing Logic Technology Featuring Novel 45nm Gate Length Strained Silicon CMOS Transistors", IEEE, © 2003.
Bhadri N. Varadarajan, "Tensile Silicon Nitride—P1264 NESL", C & F Study, Aug. 21, 2003.
Varadarajan, et al., "Strained Transistor Architecture and Method", Novellus Systems, Inc., U.S. Appl. No. 10/923,259, filed Aug. 20, 2004, pp. 1-24.
Niu et al., "Methods For Improving The Cracking Resistance Of Low-K Dielectric Materials", U.S. Appl. No. 10/860,340, filed Jun. 2, 2004.
Niu et al., "Methods For Improving The Cracking Resistance Of Low-K Dielectric Materials", U.S. Appl. No. 10/860,340, Office Action dated Mar. 2, 2005.
Niu et al., "Methods For Improving The Cracking Resistance Of Low-K Dielectric Materials", U.S. Appl. No. 10/860,340, Final Office Action dated Jun. 13, 2005.
Wang et al., "Plasma Detemplating And Silanol Capping Of Porous Dielectric Films", U.S. Appl. No. 10/785,235, filed Feb. 23, 2004.
Varadarajan et al., "Tensile Dielectric Films Using UV Curing", U.S. Appl. No. 10/972,084, filed Oct. 22, 2004.
Fox et al., "Method For Improving Mechanical Properties Of Low Dielectric Constant Materials", U.S. Appl. No. 10/849,568, filed May 18, 2004.
Fox et al., "Methods For Producing Low-Stress Carbon-Doped Oxide Films With Improved Integration Properties", U.S. Appl. No. 10/987,208, filed Nov. 12, 2004.
Van Den Hoek et al., "VLSI Fabrication Processes For Introducing Pores Into Dielectric Materials," U.S. Appl. No. 11/050,621, filed Jan. 31, 2005.
Draeger et al., "Creation Of Porosity In Low-K Films By Photo-Disassociation Of Imbedded Nanoparticles," U.S. Appl. No. 11/146,456, filed Jun. 6, 2005.
Wu et al., "Methods For Producing Low Stress Porous Low-K Dielectric Materials Using Precursors With Organic Functional Groups", U.S. Appl. No. 10/927,777, filed Aug. 27, 2004.
Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.
U.S. Office Action mailed Jul. 13, 2005, from U.S. Appl. No. 10/672,311.
U.S. Office Action mailed Jul. 27, 2005, from U.S. Appl. No. 10/785,235.
U.S. Office Action mailed Aug. 24, 2005, from U.S. Appl. No. 10/404,693.
U.S. Office Action mailed Sep. 1, 2005, from U.S. Appl. No. 10/672,305.
Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.
U.S. Office Action mailed Dec. 27, 2005, from U.S. Appl. No. 10/789,103.
U.S. Office Action mailed Dec. 23, 2005, from U.S. Appl. No. 10/800,409.
U.S. Office Action mailed Feb. 7, 2006, from U.S. Appl. No. 10/672,305.
U.S. Office Action mailed Dec. 20, 2005, from U.S. Appl. No. 10/672,311.
U.S. Office Action mailed Dec. 20, 2005, from U.S. Appl. No. 10/849,568.
U.S. Office Action mailed Jan. 9, 2006, from U.S. Appl. No. 10/785,235.
Subramonium et al., "Pulsed PECVD Method for Modulating Hydrogen Content in Hard Mask", U.S. Appl. No. 11/318,269, filed Dec. 23, 2005.
U.S. Office Action mailed Feb. 28, 2006, from U.S. Appl. No. 10/404,693.
U.S. Office Action mailed Mar. 29, 2006, from U.S. Appl. No. 10/800,377.
U.S. Office Action mailed Jun. 14, 2006, from U.S. Appl. No. 10/789,103.
U.S. Office Action mailed Sep. 7, 2006, from U.S. Appl. No. 10/820,525.
U.S. Office Action mailed Jul. 12, 2006, from U.S. Appl. No. 10/672,305.
U.S. Office Action mailed Sep. 8, 2006, from U.S. Appl. No. 10/404,693.
Wu et al., "Methods for Fabricating High Hardness/Modules Low Dielectric Constant Materials," Novellus Systems, Inc., U.S. Appl. No. 11/369,658, filed Mar. 6, 2006.
Dhas et al., "Method of Reducing Defects in PECVD TEOS Films," Novellus Systems, Inc., U.S. Appl. No. 11/396,303, filed Mar. 30, 2006, pp. 1-21.
U.S. Office Action mailed Nov. 30, 2006, from U.S. Appl. No. 10/927,777.
U.S. Office Action mailed Mar. 28, 2007, from U.S. Appl. No. 10/820,525.
U.S. Office Action mailed Jan. 24, 2007, from U.S. Appl. No. 10/789,103.
U.S. Office Action mailed May 30, 2006, from U.S. Appl. No. 10/785,235.

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 21, 2007, from U.S. Appl. No. 10/789,103.

U.S. Notice of Allowance and Fee Due mailed Dec. 19, 2006, from U.S. Appl. No. 10/800,409.

Allowed Claims from U.S. Appl. No. 10/800,409, no date available.

U.S. Office Action mailed Apr. 9, 2007, from U.S. Appl. No. 10/800,409.

Niu et al., "Methods for Improving the Cracking Resistance of Low-K Dielectric Materials," Novellus Systems, Inc., U.S. Appl. No. 11/376,510, filed Mar. 14, 2006, pp. 1-28.

U.S. Office Action dated May 22, 2007, from U.S. Appl. No. 11/376,510.

U.S. Notice of Allowance and Fee Due mailed Apr. 9, 2007, from U.S. Appl. No. 10//927,777.

Allowed Claims from U.S. Appl. No. 10/927,777, no date available.

U.S. Notice of Allowance and Fee Due mailed Dec. 20, 2005, from U.S. Appl. No. 10/860,340.

Wu et al., "PECVD Methods for Producing Ultra Low-K Dielectric Films Using UV Treatment," Novellus Systems, Inc., U.S. Appl. No. 11/608,056, filed Dec. 7, 2006, pp. 1-34.

Wu et al., "Methods for Improving Performance of ODC Films with Dielectric Constant < 4.0," Novellus Systems, Inc., U.S. Appl. No. 11/693,661, filed Mar. 29, 2007, p. 1-46.

* cited by examiner

METHODS FOR IMPROVING INTEGRATION PERFORMANCE OF LOW STRESS CDO FILMS

CROSS-REFERENCE TO RELATED PATENT APPLICATIONS

This application claims priority under 35 U.S.C. 120 from U.S. patent application Ser. No. 10/789,103, filed Feb. 27, 2004, by Wu et al., and titled METHODS FOR PRODUCING LOW-K CDO FILMS WITH LOW RESIDUAL STRESS which claims priority under 35 USC 119(e) from U.S. Provisional Patent Application No. 60/524,330, filed Nov. 20, 2003, by Wu et al., and titled "METHODS FOR PRODUCING LOW-K CDO FILM OF LOW RESIDUE STRESS WITH DIELECTRIC CONSTANT <3.0." These applications are incorporated herein by reference for all purposes.

FIELD OF THE INVENTION

This invention relates to methods for preparing dielectric films having low dielectric constants and high mechanical strength. More specifically, the invention relates to process optimization and improvement through precursor structure selection and process parameter optimization to improve the integration properties of a low stress carbon doped oxide (CDO) film, including dry etching rate, wet clean performance, optical properties, and electrical performance while maintaining a low dielectric constant.

BACKGROUND

There is a general need for materials with low dielectric constants (low-k) in the integrated circuit manufacturing industry. Using low-k materials as the interlayer dielectric of conductive interconnects reduces the delay in signal propagation and signal crosstalk due to capacitive effects. The lower the dielectric constant of the dielectric, the lower the capacitance of the dielectric and the RC delay in the lines and signal crosstalk between electrical lines of the IC. Further, the use of a low k material as an interlayer dielectric reduces the power consumption of complex integrated circuits.

Low-k dielectrics are conventionally defined as those materials that have a dielectric constant (k) lower than that of silicon dioxide (SiO2), that is k<~4. Generally, they have a dielectric constant of 3 or less. Typical methods of obtaining low-k materials include introducing pores into the dielectric matrix and/or doping silicon dioxide with various hydrocarbons or fluorine. In technology nodes of 90 nanometers and beyond, carbon doped oxide dielectric materials look extremely promising. However, wide spread deployment of these materials in modern integrated circuit fabrication processes presents some technological hurdles.

Specifically, in comparison with silicon dioxide, low k CDO materials typically have inferior mechanical properties due to the incorporation of ending methyl groups ($-CH_3$) in order to lower the k value of CDO materials. These mechanical properties include hardness, modulus, film residual stress, blanket film cracking threshold or limit, fracture toughness, etc. These properties are derived primarily from the strength of the atomic bonds and their binding energy. For instance, using conventional Si containing organics as precursors in a conventional plasma enhanced chemical vapor deposition (PECVD) process, the resulting dielectric CDO film will generally possess a dielectric constant of 2.7-2.95 with a hardness of 1.2-2.0 GPa, modulus of 6.6 to 12 GPa, and a blanket film cracking limit between 2.3-2.7 μm. It is noted that the cracking limit is an overall measure of mechanical properties of a CDO film. Many applications will require cracking thresholds of greater than 3 μm, and more preferably greater than 5 μm. CDO materials of inferior mechanical properties will have adhesive (delamination) and cohesive (cracking) failures during the Cu-low k integration and packaging steps.

These failures are exacerbated by the increasing complexity of integrated circuits and manifest as growing numbers of metallization layers. It is not uncommon for a modern IC design to require nine metallization layers, each with a separate dielectric layer. Each of these dielectric layers will have to withstand mechanical stresses from, for example, Chemical Mechanical Polishing (CMP) and/or thermal and mechanical stresses incurred during IC packaging operations.

In addition to modulus, a mechanical property of growing importance is the residual (or internal) stress in a dielectric film. Residual stress is comprised of an extrinsic stress component and an intrinsic stress component. Further, residual stress can be either compressive or tensile. Conventional low k films (k<3.2), including CDO films, typically have a tensile stress in excess of 50 Ma. The residual stresses within a deposited dielectric film are of particular interest for this invention. In IC fabrication contexts, these stresses can manifest in different ways, including cracking initiation and propagation and bowing or arching of die, which indicate net tensile or compressive stress. Low residual stress leads to low cracking driving force, a high cracking or buckling limit and hence a low failure rate during Cu-low k integration and packaging.

By way of illustration, FIG. 1a illustrates a dielectric film 105 deposited in a silicon substrate 110, in this case a carbon doped oxide (CDO) film (also known as an organo-silicate glass (OSG) film), where intrinsic tensile stress pulls the film in toward the center of the film and causes it to bend the substrate so that it is concave. A film of excessive tensile stress, such as a conventional CDO film, tends to initiate cracking spontaneously or under external influence. Further, the tensile stress tends to propel the crack propagation in the film. FIG. 1b is an illustration of a similar structure in which compressive stress pushes the film out (along the plane of the film) and causes it to bend the substrate so that it is convex. A film of excessive compressive stress tends to lead to film buckling or spontaneous delamination from the substrate. Thus a low residual stress, either tensile or compressive, of CDO film is important in the application in the Cu-low k integration and packaging.

Further, each additional layer of CDO dielectric material increases the total tensile residual stress in the test wafer. FIG. 2 is a graph of wafer-level stress as a function of number of process steps for 90 nm CDO technology and 130 nm fluorinated silica glass (SiOF) technology. This figure was taken from Jan, C. H., et al, 90 *NM Generation*, 300 *mm Wafer Low k ILD/Cu Interconnect Technology*, 2003 IEEE Interconnect Technology Conference, which is incorporated herein by reference. As shown, each additional layer of CDO dielectric material increases the total tensile residual stress in the test wafer. Clearly, more process steps lead to larger tensile stresses in the film. In a typical IC device requiring 5 or more CDO layers, the tensile residual stress creates serious problems. Note in FIG. 2 that the tensile stress development in CDO stacks is partially offset by the compressive stress of a silicon oxide layer at the top. Even if such silicon oxide layer is used in a fabrication process, it overcome the difficulties associated with significant tensile stress occurring at intermediate stages of the fabrication process.

Many device failures can ultimately be traced to stresses and their variations at various stages of IC processing. Those failures including interfacial delamination between different materials and cracking within one material during chemical mechanical polishing (CMP) and packaging. Excessive stress of thin films, such as CDO films, will also accumulate through multiple layer integration and will result in wafer warping and CMP issues. Since device feature size is continuously shrinking, stress related problems are expected to become more severe.

Thus, there is a high demand based on the current Cu-low k integration scheme that the stress of CDO films be lowered from the current level (~50 MPa or greater tensile) while raising hardness/modulus and without making sacrifices in important properties such as a dielectric constant, dry etch rate, film stability during wet cleaning, and electrical leakage current.

SUMMARY

To achieve the foregoing, methods of improving the mechanical properties of thin films, including CDO films, are disclosed. Further, this invention relates to techniques for optimizing these methods in order to avoid sacrifices in dry etch rate, film stability during wet cleaning, and electrical leakage current. Additionally, this invention discloses variations of these methods in order to optimize a CDO film's extinction coefficient.

In one embodiment of the invention, a carbon doped silicon oxide (CDO) film on a substrate is deposited on a substrate by contacting the substrate with one or more CDO precursors having a carbon-carbon triple bond and with a strong oxidizer. Because of the process conditions used and the choice of precursors, the resulting CDO film will have carbon-carbon triple bonds or their derivative forms in sufficient amounts that the CDO film will have a compressive stress or a tensile stress of between about −20 to 30 MPa and a dielectric constant of between about 2.5-3.0. Additionally, CDO films deposited according to one or more of these embodiments will have a C≡C to SiO bond area ratio of between about 0.05% to 5%, a SiC to SiO bond ratio of between about 2% to 10%, and a refractive index (RI) of 1.39-1.52 measured at 633 nm.

In some embodiments, the CDO film is formed on the substrate by a chemical deposition process (for example PECVD), using one or more precursors carried in a carrier gas (e.g., carbon dioxide) in the presence of a "strong" oxidizer (e.g., an oxygen-containing oxidant such as $O_2$, $O_3$, $N_2O$, $H_2O$ or $H_2O_2$, that improves desirable polymerization reactions during the deposition process). In a specific implementation, the CDO precursor is selected from the group consisting of Ethynyltrimethylsilane (ETMS), also known as trimethylsilaneacetylene (TMSA), and Bis(trimethylsilyl) acetylene (BTMSA).

In a PECVD embodiment, a plasma is formed in a deposition chamber such that the density of the plasma formed is in the range of between about 0.05 $W/cm^2$ and 2 $W/cm^2$. In a preferred embodiment, the strong oxidizer and the CDO precursor are supplied to the deposition chamber such that the ratio of oxidizer to CDO precursor is between about 10 sccm (gas): 1 ccm (liquid) and 500 sccm (gas): 1 ccm (liquid). Specifically, the precursor is supplied at a flow rate of about 1-3 ccm, while the strong oxidizer is supplied to the deposition chamber at a flow rate of between about 50 to 500 sccm, preferably at a flow rate of 150-250 sccm, and most preferably at a flow rate of about 150 sccm.

In another implementation of the invention, an integrated circuit (IC) with one or more CDO dielectric layers having carbon-carbon triple bonds or both and/or their derivative forms generated during the deposition is provided. In some embodiments, the CDO layer serves as an interlayer dielectric in the IC. In a preferred embodiment, the CDO dielectric layer has a residual tensile stress of −20 to 30 MPa and a dielectric constant of not greater than 3.0.

These and other features and advantages of the invention will be presented in more detail below with reference to the associated drawings.

DETAILED DESCRIPTION OF A PREFERRED EMBODIMENT

Introduction and Overview

Figure 1:
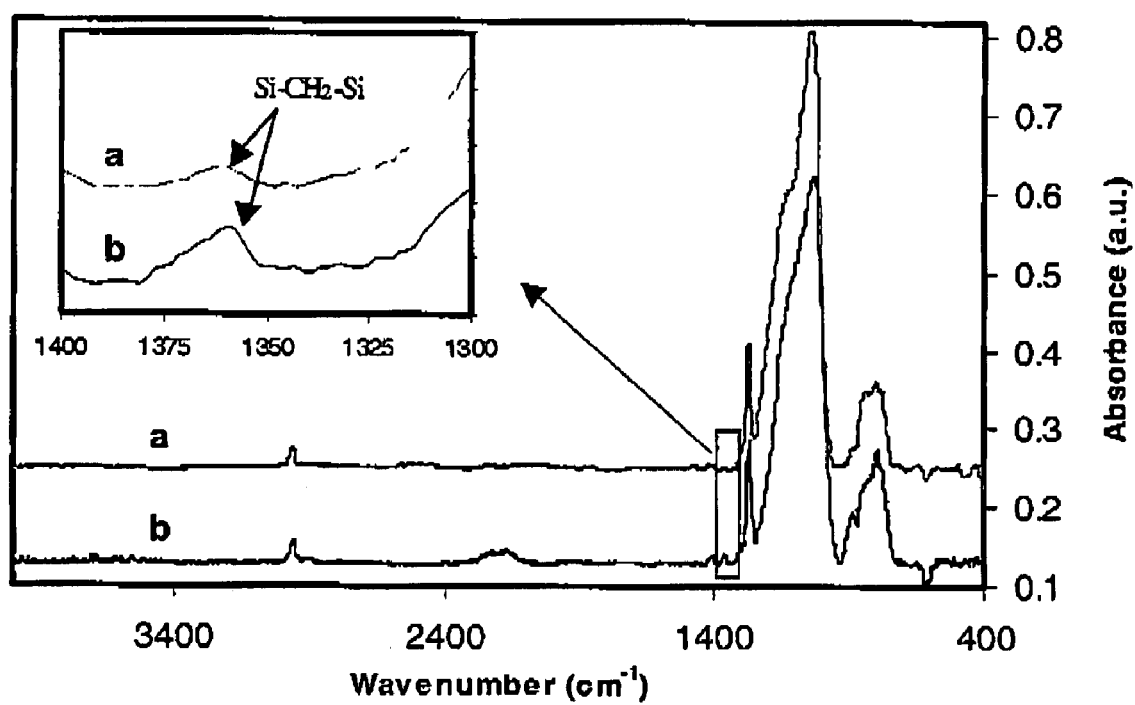
FIG. 1a illustrates a dielectric film on a substrate under tensile stress.
FIG. 1b illustrates a dielectric film on a substrate under compressive stress.
Figure 1A:
Figure 1B:
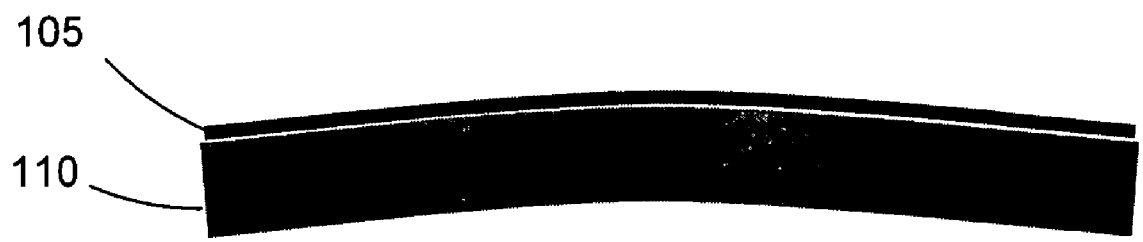
Figure 2:
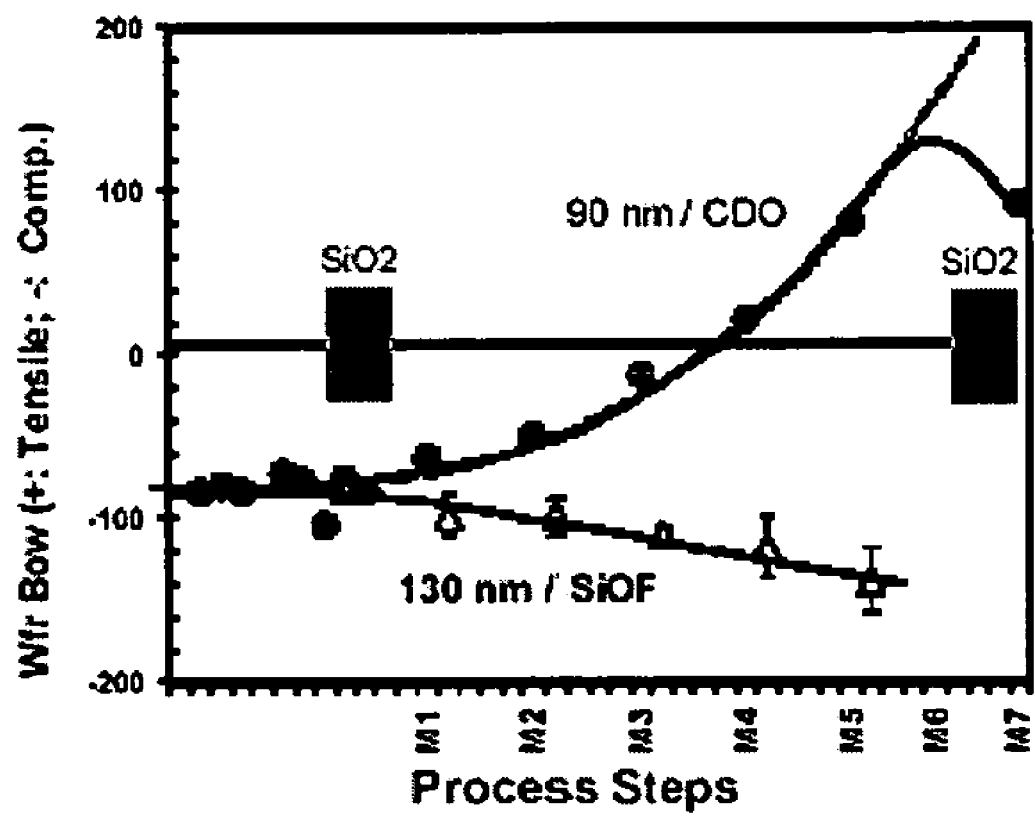
FIG. 2 is a graph of wafer-level stress as a function of process steps for 90 nm technology and 130 nm SiOF technology.

The present invention relates to methods of creating low-k carbon doped oxide (CDO) layers with high mechanical strength and low residual stress. Further, this invention relates to methods of optimizing these methods in order to avoid sacrifices in dry etch rate, film stability during wet cleaning, and electrical leakage current. Additionally, this invention discloses variations of these methods in order to optimize a CDO film's extinction coefficient.

Generally, CDO film refers to a material whose compositional elements include Si, O, C and H. It may contain traces of other elements, including fluorine (F) or germanium (Ge). The typical chemical composition of the as deposited CDO films includes 10-50 atomic percentage silicon, 5-60 atomic percentage oxygen, 5-50 atomic percentage carbon and 20-35 atomic percentage of hydrogen. "Low-k", in the context of this invention, means that the dielectric constant of the CDO layer is not greater than about 3.5, preferably not greater than about 3.0, and potentially as low as about 2.5.

The residual tensile stress of CDO films produced under unoptimized process conditions is generally >50 MPa with a typical value in the range between 60 MPa and 90 MPa. The processes of this invention significantly reduce residual film stress by altering CDO film compositional bonding structure through optimizing precursor selection and/or deposition process conditions.

As indicated above, the residual tensile stress in a thin film can arise from two different sources: intrinsic and extrinsic. Extrinsic stress is produced from a source external to the film. In integrated circuits, extrinsic stress is typically caused by the mismatch in thermomechanical properties between a dielectric layer and the underlying substrate, especially a mismatch in their thermal expansion coefficients. Lowering deposition temperature will minimize the extrinsic stress in a film, as will a smaller mismatch in coefficients of thermal expansion between the film and the substrate.

Intrinsic stress can be traced to the film-growth mechanism and the final lattice structure of the dielectric material. It depends upon the deposition conditions, such as for example during a plasma enhanced chemical vapor deposition (PECVD), the deposition temperature, the frequency and power of a radio frequency (RF) source used to generate a plasma, deposition pressure, deposition rate, and chemical precursor(s) used.

From a materials standpoint, it is believed that intrinsic stress in CDO films is determined by the backbone structure, that is the Si—O—Si matrix. CDO films produced by conventional processes possess many terminal groups such as free methyl and ethyl groups attached to the Si—O—Si matrix. The resulting Si—O—Si matrix has a structure, defined by its average bonding length and angle, that are less than ideal to match with the substrate material to yield low residual stress. It is noted by this invention that the intrinsic stress of a CDO film can be reduced by optimizing the Si—O—Si matrix structure through introducing additional bonds of different length, bonds of different angles, and cross-linking between bonds. And, in fact, it has been found through this invention that intrinsic stress can be reduced by incorporating carbon-carbon triple bonds and bonds of their derivatives in form of crosslinking in the CDO film. Further it has been found that the incorporation of these bonds and their crosslinking optimizes Si—O—Si matrix structure and reduces the tensile stress of CDO film.

Thus, in one aspect, the present invention provides CDO films including at least some carbon-carbon triple bonds and their derivative forms. These derivative forms of triple bonds include carbon-carbon double bonds, carbon-carbon single bonds, and their crosslinked forms with other compositional atoms, including Si, O, C and H, in a CDO film. As discussed below, the incorporation of carbon-carbon triple bond in the CDO film can be detected using, for example, Fourier Transformation Infrared (FTIR) spectroscopy. The content of carbon-carbon triple bond in the CDO film can be quantitatively described by the ratio of its FTIR peak area centered at ~2110 $cm^{-1}$ to the FTIR peak area of main backbone Si—O—Si matrix centered at ~1030 $cm^{-1}$. Preferably, the ratio of FTIR C—C triple bond peak area to Si—O bond area will fall in the range of about 0.05% to 20%, more preferably in the range of about 0.5% to 1.5%.

Figure 3:
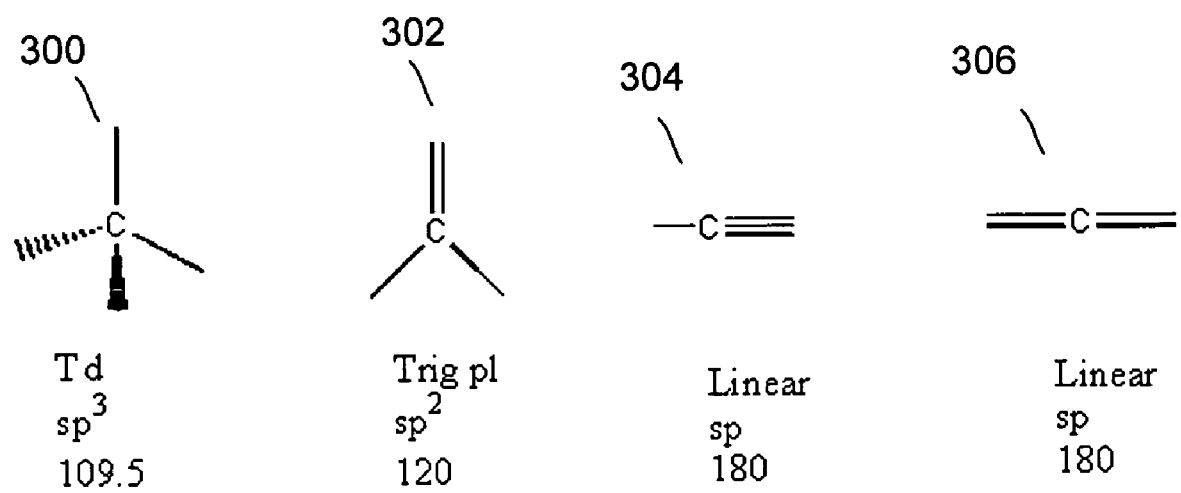
FIG. 3 is a diagram of four major structural configurations for carbon in CDO films.

The advantages gained by introducing these unsaturated groups can be understood as follows. There are four major structural configurations for carbon in CDO films. By way of illustration, FIG. 3 illustrates these configurations. The $sp^3$ structure 300 has the most degrees of freedom while the other three formats ($sp^2$ format 302 and sp formats 304 and 306) have fewer degrees of freedom and thus have more rigidity. Due to the reactive nature of deposition process and carbon-carbon triple bonds, not only triple bonds themselves but also their derivative forms will be present in CDO films. These derivative forms result from the opening of one or two of the triple bonds to form carbon-carbon double bonds or carbon-carbon bonds, and/or crosslinking to Si—O—Si network. The $sp^2$ and sp structures comprise C=C or C≡C bonds and have significantly different atom-atom of distance than do C—C, C—O, Si—O, or Si—C bonds. The nominal bond length of a C—C bond is ~1.5 Å, that of a C=C bond is ~1.3 Å and that of C≡C bond is ~1.2 Å. The nominal bond length of a C—O bond is ~1.1 Å while the nominal bond length of a Si—O bond is ~1.6 Å and that of a Si—C bond is ~1.9 Å. Because of their rigidity and bond lengths, the C=C or C—C bonds and their derivative forms provide a means to alter the Si—O—Si matrix structure and to engineer the lattice structure of CDO films in order to minimize the lattice mismatch between the CDO film and the substrate and thus lower the tensile stress commonly associated with the CDO film. Many of these structures possess an average bond angle of less than approximately 145 degrees, and a stretching vibration peak position at wavenumbers of less than 1100 $cm^{-1}$ on FTIR spectrum.

Another aspect of the invention provides deposition conditions selected to introduce increased desired bond incorporation and crosslinking/bridging within the dielectric network, e.g., by employing a dual frequency RF plasma source having a significant content of low frequency power and employing precursors that provide additional carbon content and carbon containing bonding structures. The deposition conditions are selected to enhance the incorporation of desired bonds in precursor(s) into CDO film and the crosslinking of those bonds during deposition. The desired bonds incorporated in films and their derivatives after crosslinking with other compositional atoms, e.g., Si, O, C, and/or H, in the CDO film include acetylene (Si—C≡C—Si), ethylene (Si—CH=CH—Si), ethane (Si—$CH_2$—$CH_2$—Si), methylene (Si—$CH_2$—Si), Si—CH=C(O)—Si, —CH(C)—C(O, C)—, —CH=CH—C—, —CH=CH—O—, etc. Due to the open space introduced by these bonds, CDO films containing these groups maintain relatively low dielectric constants (e.g., less than about 3).

The total residual stress of the CDO films produced using these methods (precursor and/or process optimization) should preferably have less than about 50 MPa of tensile stress, and more preferably between about 30 and −20 MPa. Note that a negative value for tensile stress indicates a compressive stress. Note further that stress was measured using a "Flexus" tool purchased from KLA-Tencor Corporation. But any tool that accurately measures bow or other deviation from planarity in a wafer can be employed.

While a primary focus of this invention is reducing residual stress in CDO films, the films preferably possess a variety of other mechanical properties rendering them suitable for integration in demanding IC fabrication processes. Examples of such other mechanical properties include hardness, modulus, blanket film cracking limit, fracture toughness (resistance to crack propagation after a crack is initiated), dry etch rate, and cracking propagation velocity. Hardness and modulus are well defined within the art and will not be discussed in detail herein. Measures of film hardness and modulus presented herein may be made with any suitable apparatus including a nano-indentation device.

In the context of the present invention, a desirable modulus range is higher than about 3 GPa, preferably higher than about 6 GPa, and most preferably in the range of between about 8 and 15 GPa.

One manifestation of residual tensile stress in a film is cracking. A film's cracking threshold is a measure of the thickness of the film on a blank substrate (e.g., a flat 200 mm wafer) that can be deposited without forming a crack. In a typical experiment, the dielectric film is deposited to various thicknesses using a single set of process conditions. The resulting wafer (with dielectric layer) is set aside without disturbance for a period of time (e.g., one day) and examined for cracks. The greatest thickness at which no crack is observed is the cracking threshold. For many processes, the cracking threshold is measured in µm. For the purposes of this invention, the cracking threshold is greater than about 3 µm. Most preferably, the cracking threshold is greater than about 5 µm.

Figure 4:
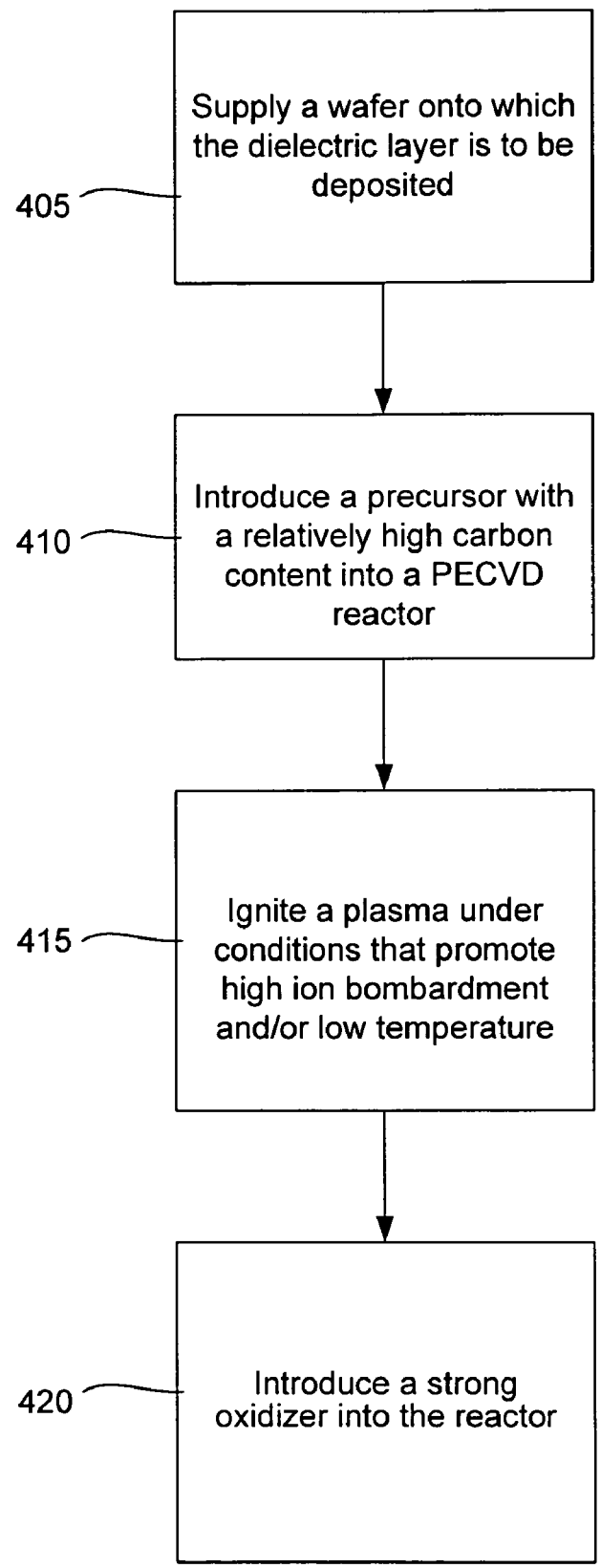
FIG. 4 is a flowchart illustrating the basic method for creating low-k CDO dielectric layers with improved integration properties.

FIG. 4 is a flowchart illustrating at a high level one methodology for creating low-k CDO dielectric layers with improved integration properties. In step 405, a wafer is supplied. In step 410, one or more precursors are introduced. Precursors are chosen to have a high carbon content and, in some embodiments, one or more double bonds or unsaturated bonds in the form of carbon-carbon triple bonds. Preferably, precursors have at least one carbon-carbon triple bond. In step 415, plasma is ignited under conditions that promote incorporation of desired compositional bond structure in the CDO film. Selection of precursors employed in step 410 is detailed in the Precursor Optimization section below. Step 415 is described in detail in the Process Optimization section, also below. The process continues with step 420, where a "strong oxidizer" is introduced into the chamber. For the purposes of the present invention, a "strong oxidizer" refers to an oxygen-containing oxidizing agent that promotes desirable polymerization reactions during the deposition process to generate desirable species, such as acetylene (Si—C≡C—Si), ethylene (Si—CH=CH—Si), ethane (Si—CH$_2$—CH$_2$—Si), methylene (Si—CH$_2$—Si), Si—CH=C(O)—Si, —CH(C)—C(O, C)—, —CH=CH—C—, —CH=CH—O—. Examples of suitable strong oxidizers in accordance with the present invention include species such as O$_2$, N$_2$O, H$_2$O and H$_2$O$_2$, and combinations thereof, which are stronger "oxidizers" for the purposes of this invention (stronger promoters of the desirable polymerization reactions) than carbon-containing species such as CO$_2$, for example. In particular embodiments, O$_2$ and H$_2$O$_2$ are preferred. Step 420 is described in detail in the Process Optimization section below. Note also, that steps 415 and 420 may occur in any order relative to the other step, as well as simultaneously.

Precursor Optimization

As indicated, both process optimization and precursor selection can have strong effects on the material properties of the film. Precursors of interest should be carbon rich and, in some embodiments, contain some degree of unsaturation (e.g., at least one carbon-carbon triple bond or double bond). Carbon may be provided in the form of alkyl groups, alkene groups (containing at least one carbon-carbon double bond), and alkyne groups (containing at least one carbon-carbon triple bond) for example. For many applications, it will be desirable to choose at least one precursor that has at least one carbon-carbon triple bond. Precursors having any of these enumerated properties may be used alone (in a process gas having a single precursor) or in combination with other precursors.

Examples of precursors for CDO dielectrics include silane (in combination with a carbon containing precursor), alkylsilanes (e.g., trimethylsilane, and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes (e.g., diethoxymethylsilane), cyclic siloxanes (e.g. alkylcyclotetrasiloxanes such as octamethylcyclotetrasiloxane (OMCTS) and tetramethylcyclotetrasiloxane (TMCTS)), and various compounds with silyl groups. Note that one example of a silane is di-tert-butylsilane. In each class of compounds, the precursor may be entirely unsaturated or it may include one or more carbon-carbon triple bonds or double bonds.

Because the CDO film is to include carbon-carbon triple bonds or double bonds (or derivative forms of these), a precursor then preferably includes at least one carbon-carbon triple bond or double bond. Precursors having carbon-carbon triple bonds or double bonds may be found in various classes of compound including, for example, silanes having at least one hydrocarbon group with a carbon-carbon double bond and at least one alkyl group or at least one oxy-hydrocarbon group, silanes having at least one hydrocarbon group with a carbon-carbon triple bond and at least one alkyl group or at least one oxy-hydrocarbon group, bis(alkylsilyl)acetylenes, bis(alkylsilyl)ethylenes, and siloxanes having pendant hydrocarbon groups with a carbon-carbon triple bond or double bond. Several silicon-containing hydrocarbons (with or without oxygen) have been identified as potential precursors that may be used in a deposition process to form CDO films of low stress having low dielectric constants. These include the following:

Ethynyltrimethylsilane (SiC$_5$H$_{10}$): ETMS, also known as trimethylsilaneacetylene (TMSA), (CH$_3$)$_3$Si—C≡C—H Propargyltrimethylsilane (SiC$_6$H$_{12}$): PTMS, (CH$_3$)$_3$Si—CH$_2$—C≡C—H Propargyloxytrimethylsilane (SiC$_6$H$_{12}$O): POTMS, (CH$_3$)$_3$Si—O—CH$_2$—C≡C—H Bis(trimethylsilyl)acetylene (Si$_2$C$_8$H$_{18}$): BTMSA, (CH$_3$)$_3$Si—C≡C—Si(CH$_3$)$_3$ 1,3-Diethynyltetramethyldisiloxane (Si$_2$C$_8$H$_{14}$O): DTDS, HC≡C—Si(CH$_3$)$_2$—O—Si(CH$_3$)$_2$—C≡C—H 1,3-Divinyltetramethyldisiloxane (Si$_2$C$_8$H$_{18}$O): DVDS, H$_2$C=CH—Si(CH$_3$)$_2$—O—Si(CH$_3$)$_2$—CH=CH$_2$ Vinyltrimethylsilane (SiC$_5$H$_{12}$): VTMS, (CH$_3$)$_3$Si—CH=CH$_2$ Vinylmethyldimethoxysilane (SiC$_5$H$_{12}$O$_2$): VMDMOS, (CH$_3$O)$_2$(CH$_3$)Si—CH=CH$_2$ Dimethylmethoxysilaneacetylene (SiC$_5$H$_{11}$O): DMMOSA, (CH$_3$O)(CH$_3$)$_2$Si—C≡CH Methyldimethoxysilaneacetylene (SiC$_5$H$_{11}$O): MDMOSA, (CH$_3$O)$_2$(CH$_3$)Si—C≡CH Dimethylethoxysilaneacetylene (SiC$_6$H$_{13}$O): DMEOSA, (C$_2$H$_5$O)(CH$_3$)$_2$Si—C≡CH Methyldiethoxysilaneacetylene (SiC$_7$H$_{15}$O$_2$): MDEOSA, (C$_2$H$_5$O)$_2$(CH$_3$)Si—C≡CH Ethyldiethoxysilaneacetylene (SiC$_8$H$_{17}$O$_2$): EDEOSA, (C$_2$H$_5$O)$_2$(C$_2$H$_5$)Si—C≡CH Dimethylsilane-diacetylene ($SiC_6H_8$): DMSDA, $(CH_3)_2Si(C\equiv CH)_2$ Methylsilane-triacetylene ($SiC_7H_6$): MSTA, $(CH_3)Si(C\equiv CH)_3$ Tetraacetylene Silane ($SiC_8H_4$): TAS, $Si(C\equiv CH)_4$ Divinyldimethylsilane ($SiC_6H_{12}$): DVDMS, $(CH_3)_2Si(CH=CH_2)_2$ The functional groups are C=C (double bonds) and C≡C (triple bonds) which may be pendent or embedded within other functionalities. Preferably, the desired functional group in the precursor(s) is the C≡C (triple bonds). During deposition, these special functional groups become integrated in the CDO film on the substrate. Rigid C≡C and/or C=C bonds, and their derivative bonding structures through crosslinking with Si, O, and C, when embedded in the CDO film, strengthen the material matrix and alter Si—O—Si backbone structure of CDO films, resulting in a more rigid lattice, thus lowering the tensile stress of the CDO film. As presented below, the incorporation of C=C and C≡C bond and their derivative forms within the Si—O—Si structure was observed by FTIR and other analytical methods.

As mentioned, such films may be formed from a single carbon-containing precursor or multiple precursors in combination. Obviously, if a single precursor is used, then it must contain at least one carbon-carbon triple or double bond, and more preferably at least one carbon-carbon triple bond. But if multiple precursors are used in combination, it is not necessary for each of them to include an unsaturated group. Various primary precursors may be employed which have no double bonds or triple bonds.

In some embodiments employing multiple precursors, a secondary precursor is introduced for the sole purpose of providing double bonded or triple bonded hydrocarbon molecules. Many of these are relatively small molecules having 2 to 6 carbon atoms and one or more carbon-carbon double bonds or carbon-carbon triple bonds. Specific examples include $C_3H_4$: $CH_3$—C≡C—H, $C_2H_2$: H—C≡C—H, $C_2H_4$: $CH_2$=$CH_2$, $C_3H_6$: $CH_2$=CH—$CH_3$, $C_3H_4$: $CH_2$=C=$CH_2$, and cyclopropene ($C_3H_4$). Other potential candidates for secondary precursors are silicon-containing hydrocarbons, or oxygen-containing hydrocarbons. The hydrocarbon groups for the CDO film (including groups containing carbon-carbon double bonds and triple bonds) may come from either the precursor chemical(s) or the carrier gas, as indicated.

The precursor, in liquid or gaseous form, is one component of the process chemicals employed during deposition. The process chemicals are those gases or liquids introduced into a reactor, such as a chemical vapor deposition (CVD) reactor, to allow deposition of the CDO film. Generally, the process gases will include at least a carrier gas and one or more precursor gases/liquids introduced to the reaction chamber via the carrier gas.

Additionally, one or more strong oxidizers are added (see definition of strong oxidizer above.) Some possible oxidizers include molecular oxygen ($O_2$), ozone ($O_3$), nitrous oxide ($N_2O$), water ($H_2O$), and hydrogen peroxide ($H_2O_2$). However, in preferred embodiments of the invention, the oxidizer is $O_2$ or $H_2O_2$.

Generally, the carrier gas is provided in much greater volumes than the precursor chemical(s). It is used as a delivery vehicle and a means for sweeping precursor materials and byproducts through the reactor. Carbon dioxide is preferred for many applications of this invention.

Some specific examples of process gases include the following.
a. TMSA+$CO_2$+$O_2$
b. BTMSA+$CO_2$+$O_2$
c. OMCTS+$CO_2$+$O_2$
d. DEMS+$CO_2$+$O_2$
e. DMMOSA+$CO_2$+$O_2$
f. DMSDA+$CO_2$+$O_2$ Apparatus The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing dielectric deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD (Plasma Enhanced Chemical Vapor Deposition) system may be used as well as, for example, an HDP CVD (High Density Plasma Chemical Vapor Deposition) system.

Figure 5:
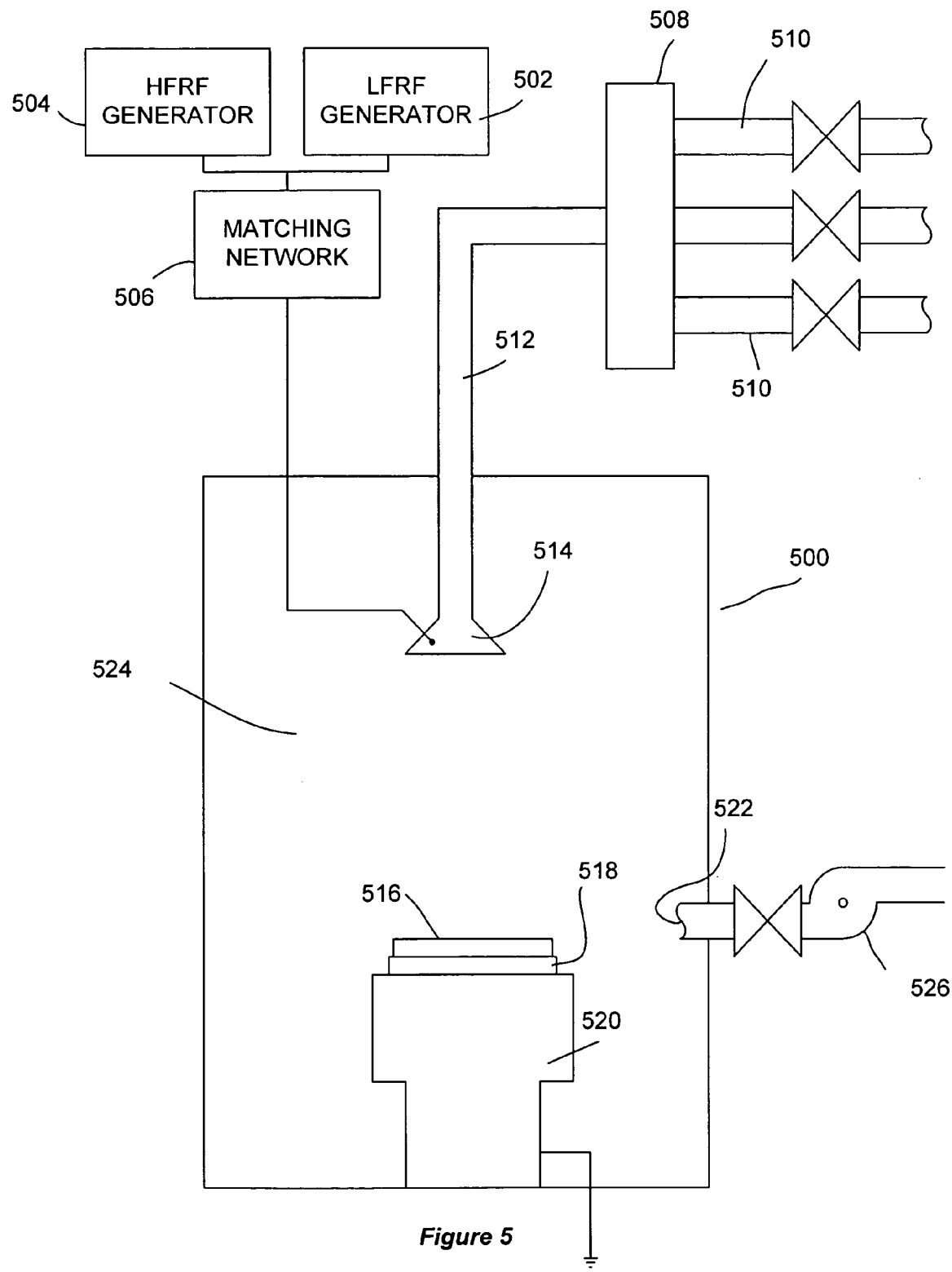
FIG. 5 provides a simple block diagram depicting various reactor components arranged as in a conventional reactor.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502 and a low-frequency RF generator 504 are connected to a matching network 506 that, in turn is connected to showerhead 514.

Within the reactor, a wafer pedestal 518 supports a substrate 516. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Process Optimization

Various deposition techniques may be employed to form the CDO dielectric materials of this invention. These include various other forms of chemical vapor deposition (CVD) including plasma enhanced CVD (PECVD), thermal CVD, low pressure CVD (LPCVD), and high-density plasma CVD (HDP CVD). HDP CVD of dielectric materials is described in various sources including U.S. patent application Ser. No. 09/996,619, filed Nov. 28, 2001 by Atiye Bayman et al. and titled "Gap Fill for High Aspect Ratio Structures", which is incorporated herein by reference for all purposes. Additionally, other techniques such as spin on techniques and deposition from supercritical solutions may be employed. But for many applications of this invention, a plasma based CVD process is employed.

Generally, the deposition conditions need to be optimized to promote the crosslinking of incorporated bonds. Without this crosslinking, the film mechanical strength will generally be low due to the fact that an increase in content of methyl group $CH_3$ as a terminating group in the CDO film will reduce the bonding density per volume thus the bonding integrity of the film. With crosslinking, the Si—O—Si matrix structure is strengthened. As a result, the mechanical strength, or the fracture toughness, of the as deposited CDO film will be high.

Compositional bonds formed in CDO film of particular interest to this invention include Si—$CH_2$—Si, Si—C≡C—Si, Si—C≡CH, Si—CH=CH—Si, Si—CH=$CH_2$, Si—$CH_2$—$CH_2$—Si and other derivatives of these bonds due to Si, C or O crosslinking, such as Si—O—C≡C—Si, Si—O—CH=CH—Si, Si—C(—H, —OSi)—$CH_2$—Si, etc. It is noted that the chemical bond length and angle varies with the degree of saturation and crosslinking. Nominal bond length of the C—C bond is ~1.5 Å, that of the C=C bond is ~1.3 Å, that of the C≡C bond is ~1.2 Å, and that of the C—O bond is ~1.1 Å while the nominal bond length of the Si—O bond is ~1.6 Å and that of the Si—C bond is ~1.9 Å. It is evident that the incorporation of C≡C bond and its derivatives (C=C, C—C) and their crosslinking within the CDO film will greatly influence the Si—O—Si matrix structure. More specifically, the Si—O—Si bond angle will change significantly as the desired C related bonds are incorporated and crosslinked. Since the Si—O—Si matrix is the backbone structure of the CDO film, the change in Si—O—Si bond angle will alter the structural mismatch between the as deposited CDO film and the substrate, hence the intrinsic stress of the CDO film. Experimental data shown below will discuss the variation of the Si—O—Si bond angle as CDO film stress lowers in more detail.

As discussed above, intrinsic stress can be reduced by incorporating C≡C bonds and their derivatives and promoting cross-linking/bridging in the CDO film. Due to the highly reactive nature of carbon-carbon triple bond, there is abundant incorporation of C≡C bond in the as deposited CDO film. If it is desired to further enhance incorporation and crosslinking within the CDO film, ion bombardment is increased during the PECVD deposition. Process conditions that increase ion bombardment may be chosen to increase one or both of (a) the mean energy of ion striking the substrate and (b) the flux of ions reaching the substrate. Physically, these results may be achieved by selecting process conditions that accomplish one of the following: (i) increasing the mean free path of the ions in the plasma, (ii) reducing the distance that an ion must travel before striking the substrate, and (iii) increasing the mean energy or momentum of the ions that strike the substrate surface.

To increase the momentum or energy of ions striking the substrate surface, at least two different process conditions may be manipulated. First, using a dual-frequency reactor of the type described below, one can increase the relative amount of the low frequency component of the RF energy supplied to the reactor. This has the effect of increasing the length of time in a given oscillation during which ions are accelerated in a single direction (toward the wafer surface). Because the ions are exposed to a field in this direction for a longer period of time, they can accelerate to higher speeds and hence strike the substrate with greater momentum. Second, one can pulse the high frequency component of the RF power to accomplish a similar result.

As is well known in the art, in general, high frequency components of the RF power delivered to a reactor control the plasma density and low frequency components produce ion bombardment of the film. The high and low frequency components can be provided at any of a number of suitable frequencies. In a typical process, the LF component is provided in a frequency range of about 100 to 600 kHz, more preferably about 200-500 kHz and the High Frequency HF component is generally between 2-60 MHz. In a preferred embodiment, the LF component is about 400 kHz and the HF component is 13.156 MHz. In terms of power, the HF component is typically supplied at between about 100-3000 W, while the LF power ranges typically between about 50-2000 W.

In one embodiment, the low frequency component of delivered RF power is between about 0 and 90 percent of the total power, and more preferably between about 0 and 50 percent of the total power. The optimal value will vary depending upon the mean free path of the ions and the various conditions that impact mean free path. In a specific example using a Vector™ reactor, produced by Novellus Systems of San Jose, Calif., with four showerheads are used, the total power delivered is about 2000 Watts on four 300 mm wafers or about 0.7 $W/cm^2$ in area density. In a second process example, a Sequel™ reactor, produced by Novellus Systems of San Jose, Calif., with six showerheads, the total power delivered is about 1200 Watts on six 200 mm wafers or about 0.6 $W/cm^2$ in area density.

Another method that may be used to increase ion bombardment during film deposition is to alter the deposition pressure. This simply increases the mean free path of ions in the deposition chamber. In one embodiment of the invention the deposition pressure is maintained at a pressure of between about 0.1 to 20 Torr, more preferably in the range of about 2.5-10 Torr.

Still another adjustment that may be used involves varying showerhead gap, defined as the distance between the showerhead and the thermal block on which the substrate is located. This varies the distance that an ion must travel before striking the substrate. The ideal gap depends on the type of reactor employed and the process conditions. For many situations, the gap is preferably between about 0.5 and 10 centimeters. For the Vector™ and Sequel™ reactors described above, the gap is about 2.5 cm.

Process optimization also includes setting the proper flow rates of the various compounds in the process gases. Note that the flow rates are chosen depending upon the amount of surface area to be covered. One can certainly scale the flow rates chosen depending upon variations in the area to be deposited, including in situations where the reactor employs fewer or greater number of wafers and possibly employs 300 mm wafers as opposed to 200 mm wafers. For the Novellus reactors described above, preferred total precursor flow rate is between about 0.5 to 10 ccm (liquid), more preferably between 2-3 ccm.

Conditions that reduce intrinsic stress generally enhance/promote the incorporation of desired bonding structures in the as deposited CDO films. However, while a certain concentration of the carbon content in form of Si—$CH_3$, C=C and/or C≡C or their derivative forms is essential to minimize the film stress, too high a carbon content in the CDO film will have a negative impact on its integration properties, especially its dry etching rate. Also, the incorporation of C≡C bonds causes a degradation of optical properties, which may be undesirable in certain applications.

In order to optimize the above process for improving dry etching rate and optical properties, the flow rate of the strong oxidizer is varied. Generally, the flow rate for the strong oxidizer ranges broadly between about 50 to 500 sccm (gas). In other preferred embodiments, the strong oxidizer flow rate ranges between about 50-300 sccm or, more preferably, between 100-300 sccm. For many of the process examples described below, where $O_2$ is used as the precursor, the most preferable strong oxidizer flow rate is about 150-200 sccm. Additionally, the flow rate of the carrier gas ranges broadly between about 50-10000 sccm and more preferably between about 3000-8000 sccm.

Figure 6:
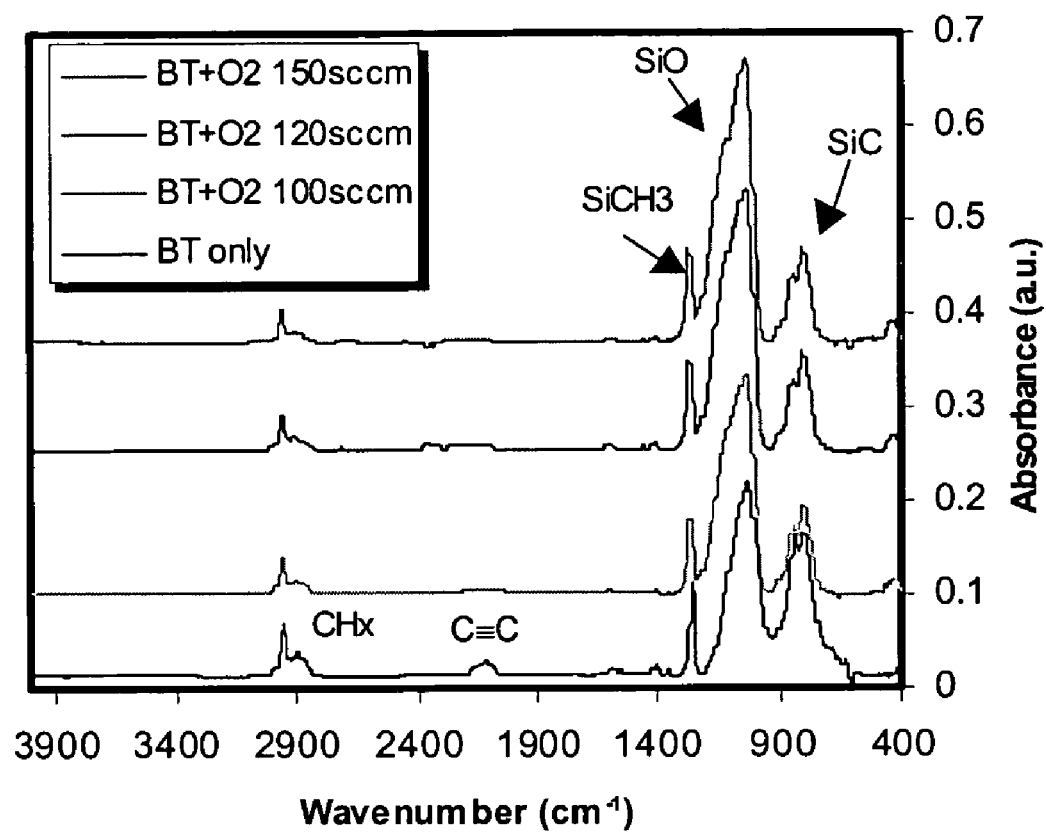
FIG. 6 shows a FTIR spectrum of BTMSA films prepared according to several embodiments of the present invention.
Figure 7:
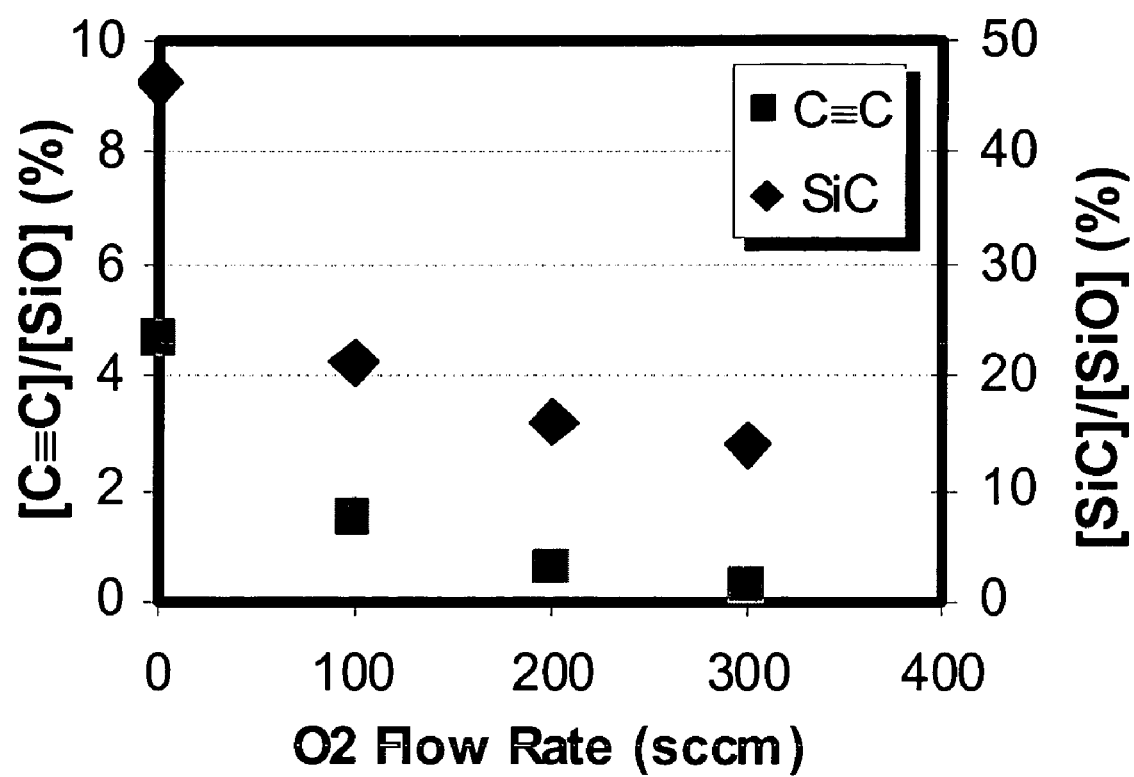
FIG. 7 is a graph showing bond ratios of C≡C/SiO and SiC/SiO for various flow rates of $O_2$.

FIG. 6 plots FTIR spectra of a low stress CDO film deposited using one of the preferred precursors, BTMSA, and using $CO_2$ as the carrier gas. A strong oxidizer ($O_2$) is introduced into the chamber at various flow rates. At an $O_2$ flow rate of 0 sccm, the FTIR spectrum shows a strong CHx peak at ~2900 $cm^{-1}$, a significant C≡C peak at ~2100 $cm^{-1}$, and significant Si—C peaks in the range of 700-900 $cm^{-1}$ relative to the Si—O peak intensity at 1000-1100 $cm^{-1}$. As $O_2$ flow rate during the deposition process is increased, the C content in the as deposited CDO film decreases gradually, as indicated by the smaller C related peaks (CHx, C≡C and Si—C). The decrease in carbon content is further illustrated by FIG. 7, which plots bond ratios of C≡C/SiO and SiC/SiO for various flow rates of $O_2$. In a preferred embodiment of the CDO film, the peak area ratio of C≡C/SiO bond ranges broadly between about 0.05% and 5%, based on the FTIR peak area, and more preferably between about 0.5% and 1.5%. For SiC/SiO bond peak area ratio, the broad range is between about 2% to 10% and the preferred range is between about 2% to 4%.

Figure 8:
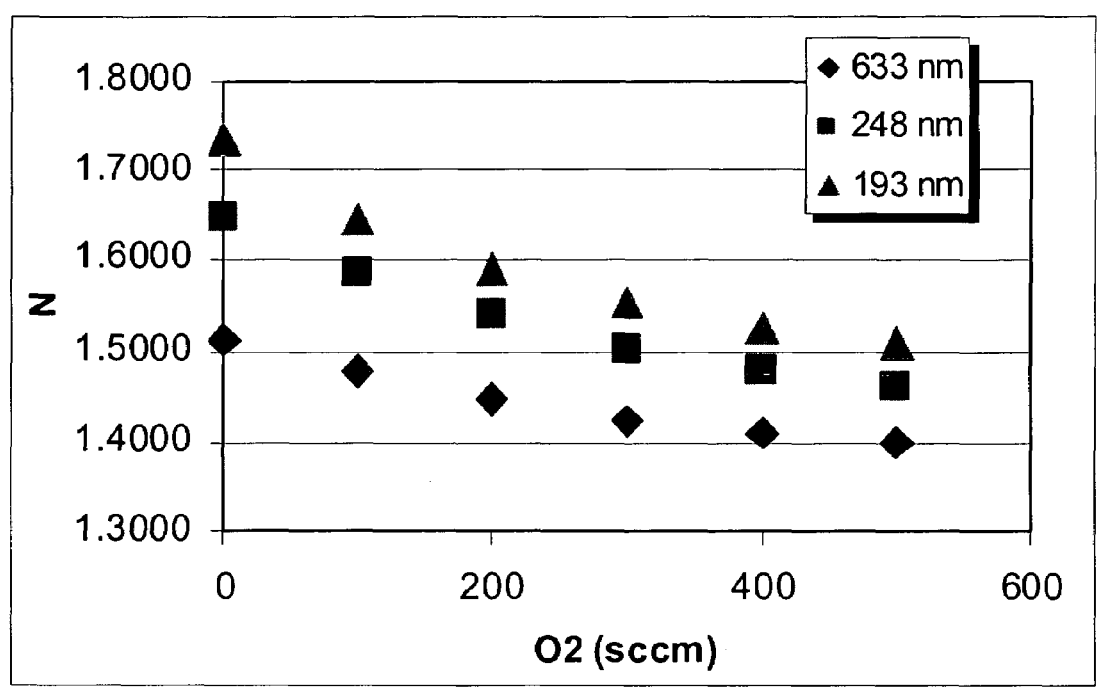
FIG. 8 is a plot of refractive index measured at 193, 248, and 633 nm vs. $O_2$ flow rate in a CDO film.
Figure 9:
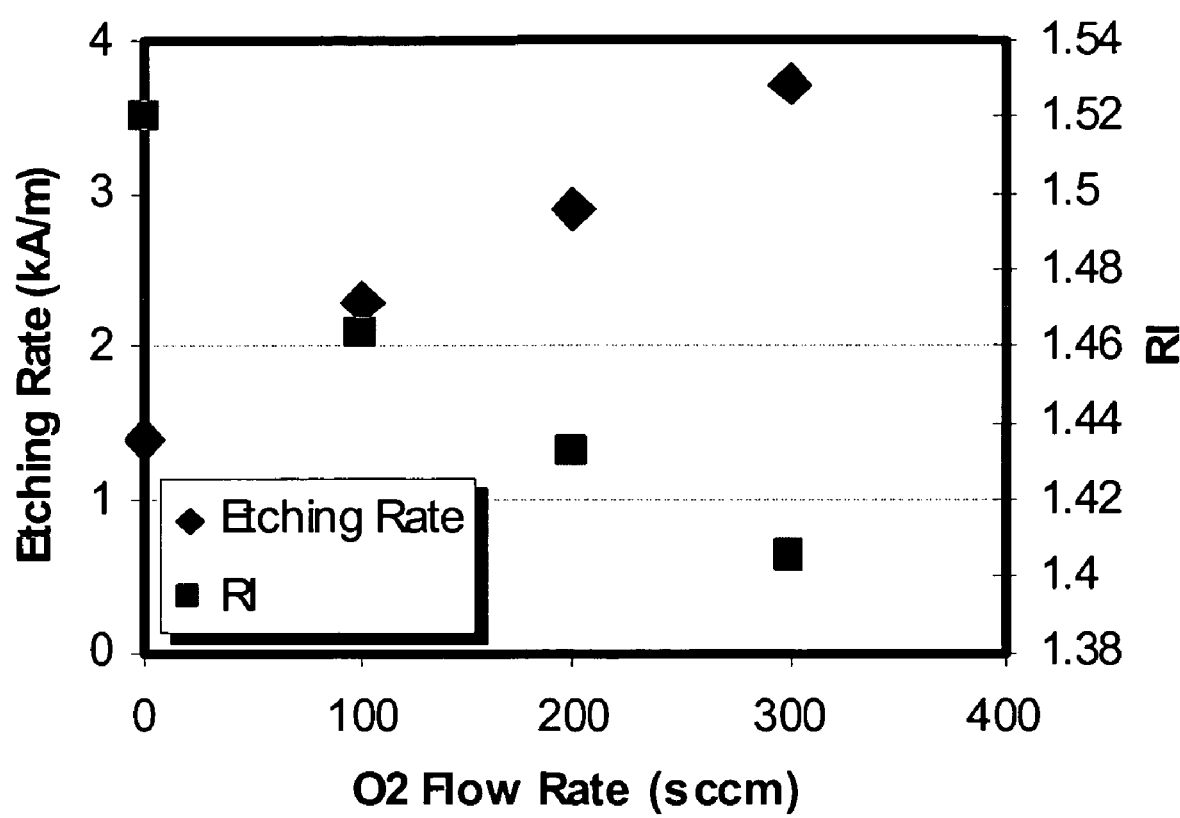
FIG. 9 is a plot of refractive index and etching rate (kA/m) versus $O_2$ flow rate.

As mentioned above, optical properties of a CDO film may degrade if the concentration of C≡C bonds is too high. Of primary importance are the optical properties at 248 nm and 193 nm, which are UV frequencies employed when using patterning lithography to build complex integrated circuits. The effect on the refractive index (RI) is illustrated in FIG. 8, which plots the RI of a CDO film at 193, 248, and 633 nm for increasing $O_2$ flow. Note that the RI decreases linearly at all 3 wavelengths of interest. It should be noted that generally RI is not intrinsically an important property of a CDO film. However, RI is indicative of carbon content in a CDO film and is used by IC manufacturers in order to get a general idea of other properties such as dry etch resistance, which is usually proportional to RI. The direct relationship between RI and dry etch resistance is illustrated in FIG. 9, which clearly shows that the etching rate of the CDO film increases linearly while the RI decreases linearly as a function of deposition $O_2$ flow rate. In a preferred embodiment of the CDO film, the RI falls in the range of between about 1.39-1.52, measured at 633 nm.

Figure 10:
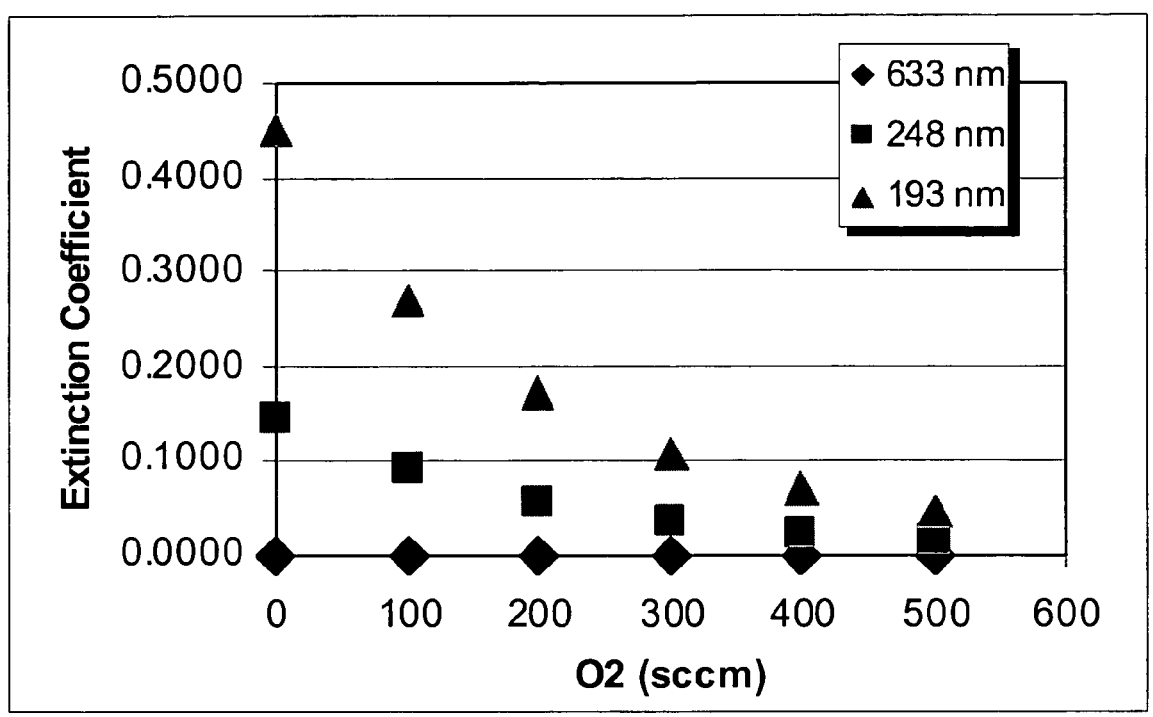
FIG. 10 is a plot of extinction coefficient measured at 193, 248, and 633 nm vs. $O_2$ flow rate.

Another important optical property of a CDO film is extinction coefficient, which is plotted in FIG. 10 versus $O_2$ flow rate at wavelengths of 193, 248, and 633 nm. If the extinction coefficients at these wavelengths are too high, then the CDO film may not be compatible with existing patterning lithography processes. Of course there are situations when a high extinction coefficient may be beneficial— for example, if the above process is run without using a strong oxidizer, the extinction coefficient at 248 nm will be approximately 0.15, while the extinction coefficient at 633 nm increases to >0.4, which makes a CDO film that could be used as an antireflective layer (ARL) during via or trench patterning. Moreover, unlike the ARL associated with a conventional dielectric constant >5.0 film, a CDO film prepared without using $O_2$ provides an ARL film of low dielectric constant (<3.5). The high extinction coefficient of low stress CDO films results from the specific compositional bonds within the film, such as C—H, C≡C, etc, which have strong light absorption peaks in the UV regimes; resulting in high values for extinction coefficient at 248 nm and 193 nm.

In general, however, a low extinction coefficient is preferred. FIG. 10 shows that increasing the $O_2$ flow rate in the deposition process causes CHx, C≡C and Si—C bonds to decrease rapidly, causing the extinction coefficient of the deposited CDO film to decrease. With a low extinction coefficient, these low stress CDO films will have little impact on existing litho patterning process used in IC circuit design. It should also be noted that, while the effect of increasing $O_2$ flow is notable at 248 nm and 193 nm, the extinction coefficient at 633 nm is unaffected by $O_2$ flow rate.

Another important integration property in a CDO film is the ability to survive a wet cleaning process during IC manufacturing. The wet clean process is typically applied after via or trench dry etching processes. If the film has a poor resistance to the cleaning agent, it will flake off during the cleaning process, which is undesirable in many applications.

However, the addition of a strong oxidizer during the formation of the film has a beneficial effect on a film's ability to survive wet cleaning. To study the film stability during wet cleaning, a wet etch study was conducted on 5000 Å films using a buffered HF solution. Bath conditions were as follows: the temperature was 24.5 C; the buffered HF ratio was 7:1; and the wet etching time for each wafer was 1 min. Each wafer was cleaned in a freshly prepared wet etch bath to avoid bath aging effects. The control film was formed using a process known to have poor wet etching resistance leading to peeling or flaking. Three CDO films prepared according to a preferred embodiment of the above method using TMSA+$CO_2$+$O_2$ were tested. The results are shown on table 1 below.

TABLE 1

| Film | Flaking during Wet Etch | Wet Etch Rate |
|---|---|---|
| Control | Yes | Failed |
| LS CDO w/$O_2$ = 0 sccm | No | <10 Å/min |
| LS CDO w/$O_2$ = 200 sccm | No | <10 Å/min |
| LS CDO w/$O_2$ = 500 sccm | Yes | Failed |

It is clear from the above results that low $O_2$ flow rates provide superior wet etch resistance, which implies similar performance in a wet cleaning process with similar chemistry. However, further increases in the $O_2$ flow rate cause a degradation in film performance. In fact, at 500 sccm of $O_2$, the film's wet etch resistance has degraded to the level of the control film, making it unsuitable for many applications. However, for the preferred $O_2$ flow rates used to optimize dry etch rate and optical properties (i.e. 50-200 sccm), excellent wet etch resistance is achieved.

Other Advantages

Figure 11:
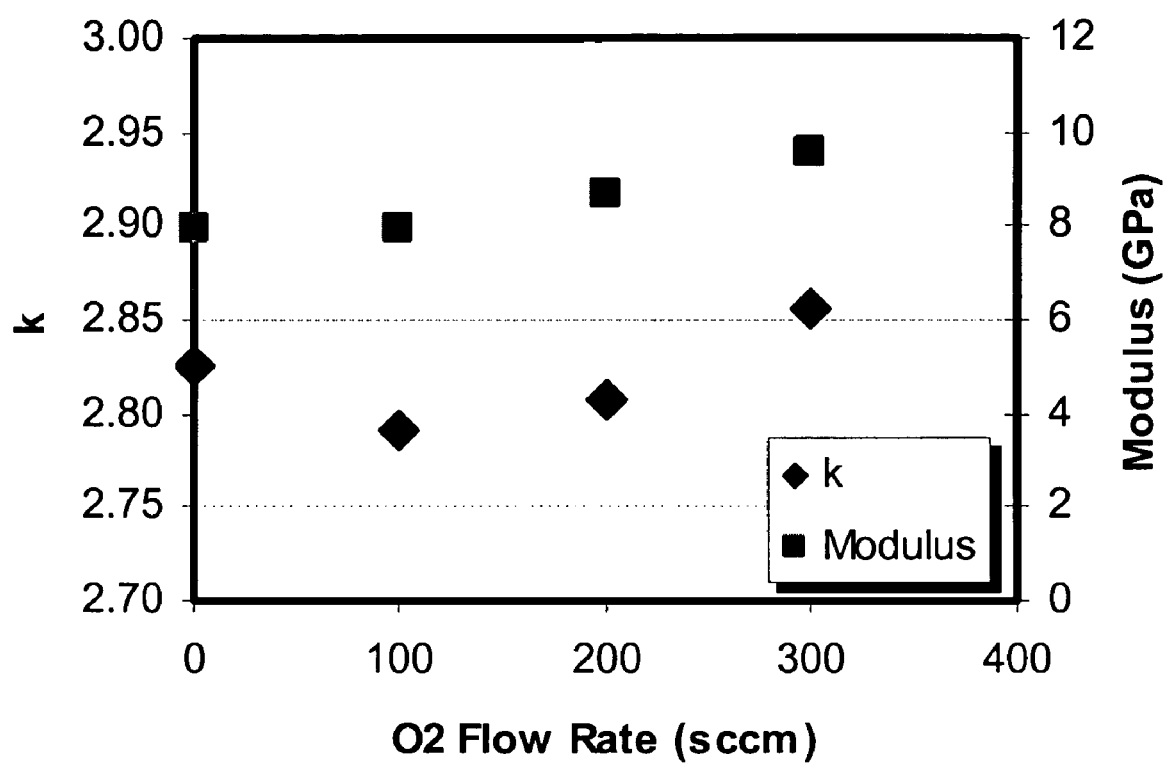
FIG. 11 is a plot of k-value and modulus versus $O_2$ flow rate.

It is important to note that the other film properties of a low stress CDO film are not compromised by optimizing integration properties. This is illustrated by FIG. 11, which plots film modulus and k value as a function of $O_2$ flow rate in the deposition process. Looking at the figure, it can be seen that, for an $O_2$ flow rate of less than 200 sccm, the film dielectric constant is not significantly impacted while the modulus increases slightly.

Figure 12:
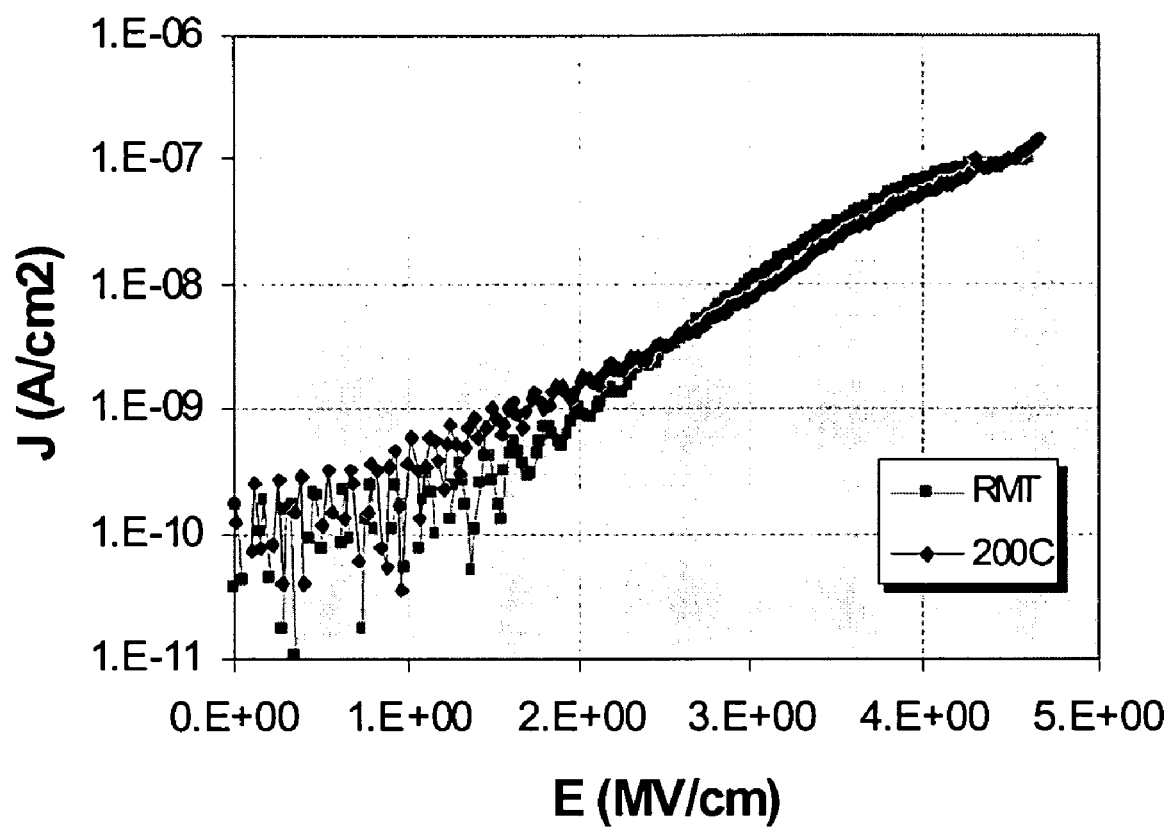
FIG. 12 is a graph showing film leakage current as a function of field strength for films applied at room temperature (RMT) and 200° C.

Further, the electrical performance of CDO films formed according to preferred embodiments of the above method is not negatively impacted either. FIG. 12 is a plot of electrical leakage current of a blanket low-stress CDO film as a function of applied electrical field strength at both room temperature and 200° C. The data indicates superior electrical performance of these low-stress CDO films.

Applications

This invention broadly applies to deposition of low-k low residual stress CDO dielectric materials on any substrate type. In many cases, however, the CDO dielectric materials will be used in integrated circuits or other electronic devices. A preferred use for the CDO films of this invention is for interlayer dielectric (ILD) applications (including both inter-level dielectrics (between active devices and the first metallization layer and intermetal dielectrics ("IMD" between adjacent metallization layers)). In these applications, the CDO films serve to replace conventional silicon dioxide or fluorinated silica glass (FSG) materials. Examples of non-ILD applications include barrier and etch-stop (ES) layers, antireflective layers (ARL), hardmask layers, etc.

The ultimate thickness of a CDO dielectric film produced in accordance with this invention depends upon the application. For example, the final thickness for an interlayer dielectric or packaging application may range from 400 Angstroms to about 2 to 3 micrometers (μm). In some cases, extra thickness is required to provide some amount of sacrificial dielectric to accommodate a subsequent planarization step.

In a preferred embodiment, the CDO films produced in accordance with this invention are used in multiple metallization layers. Such devices may have, for example, five or more metallization layers and five or more associated CDO films.

OTHER EMBODIMENTS

While this invention has been described in terms of certain embodiments, there various alterations, modifications, permutations, and substitute equivalents, which fall within the scope of this invention. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:

1. A method of preparing a carbon doped silicon oxide (CDO) film on a substrate, the method comprising:

(a) providing the substrate to a deposition chamber; and (b) contacting the substrate with one or more CDO precursors having a carbon-carbon triple bond and with an oxidizer under process conditions whereby the CDO film is formed on the substrate, and whereby the CDO film contains carbon-carbon triple bonds and their derivative bonds; wherein the substrate is contacted with one or more CDO precursors having a carbon-carbon triple bond and an oxidizer in a dual frequency plasma enhanced deposition process such that CDO film has carbon-carbon triple bonds or their derivative forms in sufficient amounts that the CDO film has a compressive stress or a tensile stress of between about −20 to 30 MPa and a dielectric constant of between about 2.5-3.0 has a cracking threshold of at least 3 um: and wherein the oxidizer is selected from the group consisting of $O_2$, $N_2O$, $H_2O$, $O_3$, $H_2O_2$, and combinations thereof.

2. The method of claim 1, wherein the substrate is a partially fabricated integrated circuit.

3. The method of claim 1, wherein the CDO film is an interlayer dielectric in an integrated circuit.

4. The method of claim 1, wherein the deposition chamber comprises one or multiple stations that allow processing one or multiple substrates in parallel.

5. The method of claim 1, wherein contacting the substrate involves contacting with a single CDO precursor in a carrier gas and an oxidizer selected from $O_2$, $N_2O$, $H_2O$, $O_3$, $H_2O_2$, and combinations hereof.

6. The method of claim 5, wherein the carrier gas is carbon dioxide.

7. The method of claim 5, wherein the carrier gas is supplied to the deposition chamber at a flow rate of 50-10000 sccm.

8. The method of claim 5, wherein the carrier gas is supplied to the deposition chamber at a flow rate of 3000-8000 sccm.

9. The method of claim 5, wherein the plasma is formed in a deposition chamber using six showerheads with diameter of about 200 mm, where the distance between the showerhead and the wafer is between about 10 mm and 100 mm, the HF power is 100-3000 W at about 14 MHz, and the LF power is 50-2000 W at between about 100 to 600 kHz.

10. The method of claim 5, wherein the plasma is formed in a deposition chamber using four showerheads with diameter of about 300 mm, wherein the distance between the showerhead and the wafer is between about 10 mm and 100 ml, the HF power is 100-4000 W at about 14 MHz, and the LF power is 50-2000 W at between about 100 to 600 kHz.

11. The method of claim 5, wherein the plasma density is between about 0.05 W/cm$^2$ and 2 W/cm$^2$.

12. The method of claims 9, 10, or 11, wherein the oxidizer and the CDO precursor are supplied to the deposition chamber such that the ratio of oxidizer to CDO precursor is between 10 sccm: 1 ccm and 500 sccm: 1 ccm.

13. The method of claim 5, wherein the CDO precursor is supplied to the deposition chamber at a flow rate of about 0.5-10 ccm.

14. The method of claim 13, wherein the oxidizer is supplied to the deposition chamber at a flow rate of between about 50 to 500 sccm.

15. The method of claim 5, wherein the CDO precursor is supplied to the deposition chamber at a flow rate of about 2-3 ccm.

16. The method of claim 15, wherein the oxidizer is supplied to the deposition chamber at a flow rate of between about 100 to 250 sccm.

17. The method of claim 16, wherein the oxidizer is supplied to the deposition chamber at a flow rate of between about 150 to 200 sccm.

18. The method of claim 17, wherein the oxidizer is supplied to the deposition chamber at a flow rate of about 150 sccm.

19. The method of claim 1, wherein the one or more CDO precursors are provided in a carrier gas.

20. The method of claim 1, wherein the CDO precursor comprises one or more compounds selected from the group consisting of Ethynyltrimethylsilane (ETMS), also known as trimethylsilaneacetylene (TMSA), Bis(trimethylsilyl)acetylene (BTMSA), dimethylmethoxysilaneacetylene (DM-MOSA) and dimethylsilane-diacetylene (DMSDA).

21. The method of claim 1, wherein the CDO precursor comprises one or more compounds selected from the group consisting of Ethynyltrimethylsilane (EMS), also known as trimethylsilaneacetylene (TMSA), and Bis(trimethylsilyl)acetylene (BTMSA).

22. The method of claim 1, wherein the oxidizer is selected from the group consisting of $O_2$ and $H_2O_2$.

23. The method of claim 1, wherein the deposited CDO film has a C≡C to SiO bond ratio of between about 0.05% to 5%.

24. The method of claim 1, wherein the deposited CDO film has a SiC to SiO bond ratio of between about 2% to 10%.

25. The method of claim 1, wherein the deposited CDO film has refractive index (RI) of 1.39-1.52 measured at 633 nm.

26. The method of claim 1, wherein the CDO dielectric layer has a modulus of not less than about 6 GPa.

27. The method of claim 1, wherein the CDO dielectric layer has a modulus of between about 8 and 15 GPa.

28. The method of claim 1, wherein the deposition pressure is maintained at a pressure of between about 0.1 to 20 Torr.

29. The method of claim 1, wherein the deposition pressure is maintained at a pressure of between about 2.5-10 Torr.

* * * * *

UNITED STATES PATENT AND TRADEMARK OFFICE
CERTIFICATE OF CORRECTION

| | | |
|---|---|---|
| PATENT NO. | : 7,326,444 B1 | Page 1 of 1 |
| APPLICATION NO. | : 10/941502 | |
| DATED | : February 5, 2008 | |
| INVENTOR(S) | : Wu et al. | |

It is certified that error appears in the above-identified patent and that said Letters Patent is hereby corrected as shown below:

In line 3 of claim 21 (column 17, line 16) change "EMS" to --ETMS--.

Signed and Sealed this

Sixteenth Day of September, 2008

JON W. DUDAS
*Director of the United States Patent and Trademark Office*